United States Patent [19]
Humpherys

[11] Patent Number: 5,656,929
[45] Date of Patent: Aug. 12, 1997

[54] METHOD AND APPARATUS FOR MEASURING RF POWER IN A TEST SET

[75] Inventor: Melvin D. Humpherys, Spokane, Wash.

[73] Assignee: Hewlett-Packard Company, Palo Alto, Calif.

[21] Appl. No.: 548,067

[22] Filed: Oct. 25, 1995

[51] Int. Cl.$^6$ .......................... G01R 23/06; G01R 21/04; G01R 21/00
[52] U.S. Cl. .......................... 324/95; 455/67.1; 455/115; 324/76.11
[58] Field of Search .......................... 324/95, 73.1, 76.77, 324/115, 118, 132, 119, 76.11; 455/67, 115, 326, 165

[56] References Cited

U.S. PATENT DOCUMENTS

| | | | |
|---|---|---|---|
| 4,341,994 | 7/1982 | Kawasaki et al. | 324/132 |
| 4,673,870 | 6/1987 | Strickland et al. | 324/74 |
| 5,493,210 | 2/1996 | Orndorff et al. | 324/95 |

FOREIGN PATENT DOCUMENTS

| | | | |
|---|---|---|---|
| 1 047 762 | 7/1963 | United Kingdom . | |
| 1 325 920 | 12/1970 | United Kingdom | 19/10 |
| 1 277 552 | 4/1971 | United Kingdom | 1/10 |

Primary Examiner—Kenneth A. Wieder
Assistant Examiner—Barry C. Bowser
Attorney, Agent, or Firm—Edward L. Miller

[57] ABSTRACT

An economical, wide range and accurate power measurement technique switches an RF detector between an applied RF IN to be measured and a COMPARISON RF IN, to thus develop a difference signal. The difference signal is filtered, amplified by a logarithmic amplifier, and then converted into a DC error signal by a synchronous detector operating in step with the switching of the RF detector. The DC error signal is applied to an integrator whose output is a loop control signal. Assuming a square law detector, the square of the loop control signal is linearly proportional to the applied RF IN once a servo loop is nulled by making COMPARISON RF IN equal to RF IN. The desired power measurement is performed by digitizing the loop control signal and performing the appropriate arithmetic operations thereon. The loop control signal is also applied to an analog multiplier, where it combines with an internal RF reference signal to produce, at the output of an attenuator following the multiplier, the COMPARISON RF SIGNAL. The entire loop servos to minimize the difference between the applied RF IN and the COMPARISON RF SIGNAL. When RF IN gets small an increase in attenuation allows the multiplier to continue to operate within an optimum dynamic range by reducing the COMPARISON RF SIGNAL to the same general level as RF IN.

12 Claims, 1 Drawing Sheet

METHOD AND APPARATUS FOR MEASURING RF POWER IN A TEST SET

BACKGROUND OF THE INVENTION

As developments proceed in the telecommunications industry, demands arise for various kinds of test equipment specifically intended for test, repair and calibration of particular classes of equipment, such as, for example, cellular phones. We shall call such a piece of dedicated test equipment a "test set". Think of a test set as a unitary commercial version of a special purpose laboratory set-up involving a collection of separate instruments. A test set might even be of laboratory quality and intended for use primarily at the factory level. One capability that is very useful in a test set for telecommunications equipment is that of measuring RF power. And while there are many commercial RF power meters on the market, some with very wide ranges of frequency and power level, and all very accurate, it is generally not economical to include one of these as a component in a test set. A need exists for an economical method of including in a test set the ability to perform sensitive and accurate RF power measurements over a wide range of power levels and frequencies.

SUMMARY OF THE INVENTION

A solution to the problem of economical, wide range and accurate power measurement in a test set is to switch an RF detector between an applied RF IN to be measured and a COMPARISON RF IN, and thus develop a difference signal. The difference signal is filtered, amplified by a logarithmic amplifier, and then converted into a DC error signal by a synchronous detector operating in step with the switching of the RF detector. The DC error signal is applied to an integrator whose output is a loop control signal. Assuming that the detector is a square law device, the square of the loop control signal is linearly proportional to the applied RF IN once a servo loop is nulled by making COMPARISON RF IN equal to RF IN. The desired power measurement is performed by digitizing the loop control signal. The loop control signal is also applied to an analog multiplier, where it combines with an internal RF reference signal to produce, at the output of an attenuator following the multiplier, the signal COMPARISON RF IN. The entire loop servos to minimize the difference between the applied RF IN and COMPARISON RF IN. When RF IN gets small an increase in attenuation allows the multiplier to continue to operate within an optimum dynamic range by reducing COMPARISON RF IN to the same general level as RF IN.

DESCRIPTION OF A PREFERRED EMBODIMENT

Figure 1:
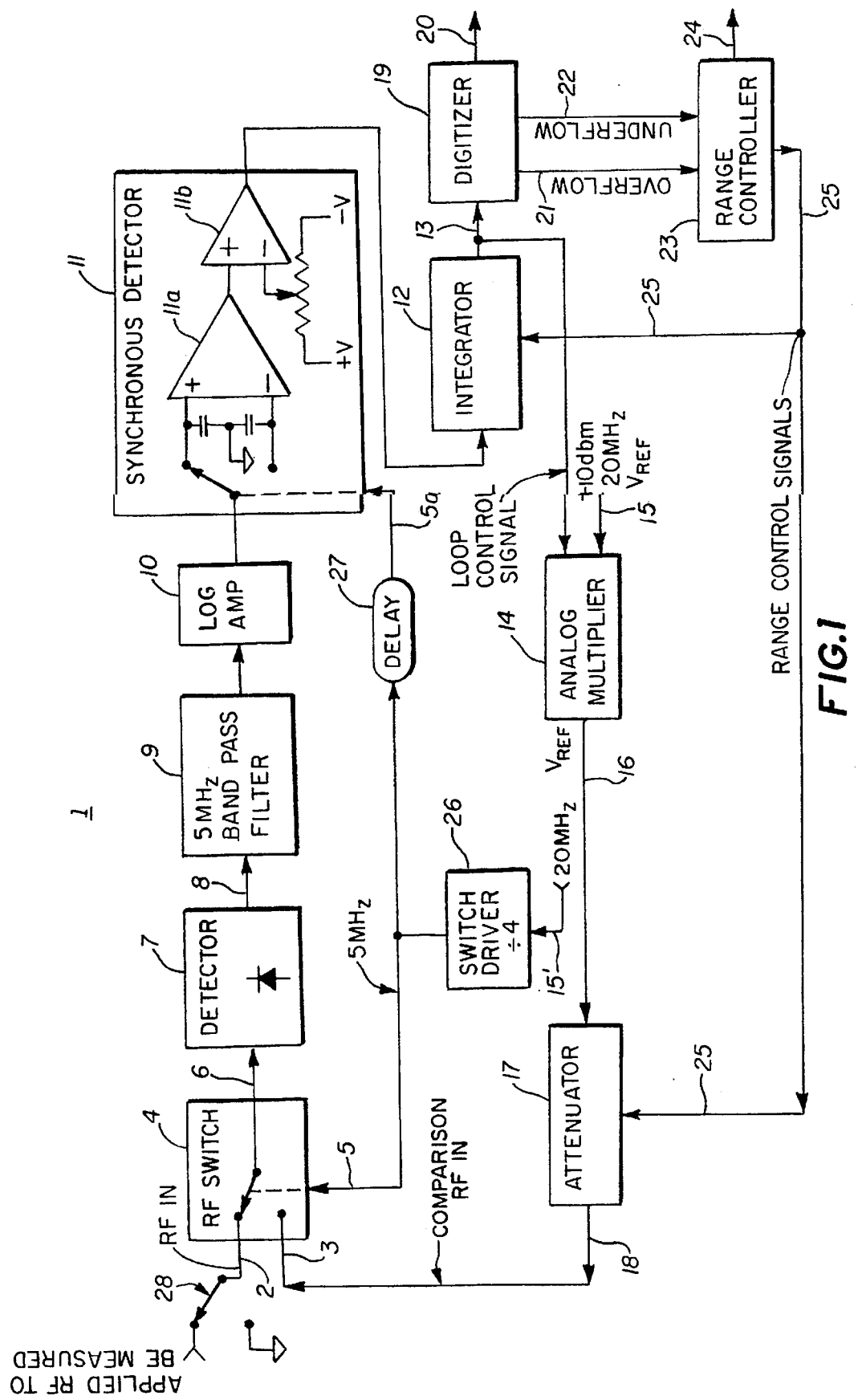
FIG. 1 is a simplified block diagram of a power measurement apparatus constructed in accordance with the teachings herein and suitable for use in a test set.

Refer now to FIG. 1, wherein is shown a simplified block diagram 1 of an RF power measurement apparatus constructed in accordance with the principles of the invention. Assume that the RF switch 28 is in the position shown. RF power to be measured is thus applied to an RF IN input terminal 2 which is one of two input terminals (2, 3) of an RF switch 4. The other input 3 is a COMPARISON RF IN whose origin will be discussed in due course. At present it will be appreciated that RF switches 28 and 4 each function as a single pole double throw switch, although they are of an internal geometry that is suitable for use in conjunction with transmission lines carrying signals in the frequency range of from about 100 MHz to in excess of 3 GHz, and having power levels in the vicinity of from −40 dbm to +10 dbm. A preferred RF switch is a GaAs semiconductor circuit; e.g., an Alpha Industries AS004M2-11.

A switching signal 5 determines which input (2, 3) is connected to an output terminal 6. In the present embodiment the RF switch 4 is being used as a "chopper"; i.e., it switches back and forth at a regular rate between the two inputs so that what appears at the output 6 is a signal whose power level varies at the switching rate and by an amount proportional to the difference between the power levels of RF IN and COMPARISON RF IN. As the explanation proceeds it will be understood that the present circuit arrangement contemplates that the two signals RF IN and COMPARISON RF IN each be high enough in frequency that their RMS power levels are each realizable for at least several cycles during each "position" of the RF switch 4. It is preferred that the present embodiment switch at a fairly fast rate, say, at 5 MHz. This rate is desirable to allow a servo loop that adjusts COMPARISON RF IN (18, 3) to track RF IN 2 to have sufficient bandwidth to measure bursts of RF at RF IN that are on the order of tens of microseconds in duration, such as are found in TDMA operation for cellular phones.

An RF detector 7 is connected to the output 6 of the RF switch 4. It produces a unipolar output signal 8, the square of whose magnitude is proportional to the amount of RF power applied thereto. That is, it is a square law detector, and it produces a time variant signal (e.g., a 5 MHz square wave for the case where there is no significant modulation on RF IN 2) indicative of the difference in power level between RF IN and COMPARISON RF IN. As will become clear, the overall RF power measurement scheme is a feedback servo system that nulls the difference produced by the RF detector 7. It is not, in principle, necessary to use a square law detector, or even a diode detector, although it so happens that such are used in the present embodiment. (However, use of a non-square law detector will change the way the result is arithmetically interpreted.) Flat frequency response is an issue, however, since RF IN and COMPARISON RF IN generally do not have the same frequency. A particular detector that has been successfully used over the range of 100 MHz to 3 GHz is an HSMS-2852 from the Hewlett-Packard Co (a zero bias pair of Schottky diodes).

A filter 9 is coupled to the output of the detector 7. This filter removes from the detector 7 any feed through of the original RF signals, and it reduces any amplitude variations in the detected level that arises from modulation on the RF IN signal. Think of filter 9 as a 5 MHz bandpass filter whose output is a clean error signal upon which the servo loop will operate.

The output of the filter 9 is applied to an amplifier 10. Its job is to amplify the error signal to such an extent that even when the power level of RF COMPARISON IN matches that of RF IN to a desired degree of accuracy, there remains a usable amount of error signal with which to control the loop and maintain that match. In this regard, it will be appreciated that the dynamics of loop behavior are enhanced if the amplifier 10 is a log amplifier. That way, it has low gain for large error signals and high gain for small ones. This has the desirable result of maintaining essentially constant loop bandwidth over a wide dynamic range of input levels.

The output of the amplifier 10 is coupled to the input of a synchronous detector 11. The synchronous detector 11 is controlled by a delayed version 5a of the signal 5 that controls the RF switch 4. Delay element 27 delays signal 5a behind signal 5 by an amount that compensates for the delay of the error signal as it passes through filter 9 and amplifier 10. In the present embodiment the value of the delay is 40 nsec. And although we have shown signal 5 being delayed to produce signal 5a, it could as easily be the case that they are each simply generated separately in accordance with a desired timing relationship.

In the terminology of earlier chopper stabilized loops, such as in precision voltmeters and DC standards, if the RF switch 4 is the front end (modulator) of a chopper, then the synchronous detector 11 is the "demodulator" for the chopper. We show the chopper demodulator as a switching arrangement that creates the difference between the values of the amplifier output at the different switch positions (i.e., the switch, capacitors on the inputs of differential amplifier 11a and differential amplifier 11a itself). This is essentially a stored differential measurement synchronized to the switching rate of 5 MHz, since during that period when the switches are connected to RF IN the conveyed signal could be either greater or less than the level for COMPARISON RF IN (which appears in the waveform only during the other position of the switches). Other synchronous detector schemes might be used. Essentially, the synchronous detector 11 functions to recover from the time variant (5 MHz) amplified error signal a DC error signal usable in nulling the loop.

The output of the synchronous detector 11 is coupled to an integrator 12. One way to view the integrator is as a filter whose job it is to help determine the transient response of the loop and to prevent loop oscillation despite the high gain of amplifier 10. The settling time in response to an abrupt step in applied power level at RF IN is about 5 microseconds (for 0% to 98%). Another, and perhaps the central, way to view the integrator 12 is this: The DC error signal from the synchronous detector is basically an indicator of which direction COMPARISON RF IN should be adjusted to null the loop. Continued presence of a signal indicating that COMPARISON RF IN should be increased needs to actually cause an increase in COMPARISON RF IN. That is a job for an integrator. The integration of the DC error signal continues until COMPARISON RF IN equals RF IN. As the difference in power level of the two RF signals diminishes, the size of the DC error signal will be diminished, also, and this results in a smaller rate of change in COMPARISON RF IN. In due course the loop will converge, and the output of the integrator will hold steady. This converged condition will continue until the power level of RF IN changes, or something in the loop drifts.

Thus, in time, the value of COMPARISON RF IN may be slightly too big, and the logical sense and polarity of the DC error signal will change. The integrator 12 will then begin reducing COMPARISON RF IN until it is again slightly too small. So, the loop generally converges to an error of zero (although it might have to track a varying input, instead); alternatively, it might have to hunt, with acceptably small steps, about some value that may be drifting or be noisy.

Thus, it is fundamentally the integrator 12, and not the amplifier 10, that provides the gain that slews the loop towards the nulled condition.

Now consider the case when there is zero or a very small signal applied as RF IN. It is undesirable to have the integrator output hunting about either side of the corresponding output value, which is zero volts. The reason is that the multiplier in use does not respond gracefully to a negative input from the integrator; the result is a region of hysteresis, or a failure of the servo loop to track. To prevent this a small offset (say, one millivolt) is introduced in the DC error signal produced by the synchronous detector 11. Adding this small offset is the purpose of the second differential amplifier 11b, with its adjustable voltage on the (−) input, within the synchronous detector 11.

The output of the integrator 12 is called the "loop control signal" 13, and it is applied to two different mechanisms. The first of these is a multiplier 14. Multiplier 14 is an analog multiplier that forms the product of the loop control signal 13 and an internal RF reference voltage $V_{REF}$ 15. $V_{REF}$ is an RF signal of constant and convenient magnitude, and that is of the same frequency as COMPARISON RF IN (say, +10 dbm and 20 MHz). The resulting 20 MHz product at the output of the multiplier 14 is applied to an attenuator 17, whose output 18 is COMPARISON RF IN and which is coupled to input 3 of the RF switch 4. One could think of the multiplier as functioning as a 100% modulator onto a carrier of variable power.

One particular multiplier used (it is described below) actually treats the values of the inputs in volts as the digit sequences to be multiplied. That is, 0.5 volts $V1_{IN}$ times 0.5 volts $V2_{IN}$ equals 0.25 volts $V_{OUT}$. Likewise, if both inputs are one volt the output is also one volt (one volt is unity, or the multiplicative identity). This convenient state of affairs is not necessary. Other multipliers that "scale the numbers to the inputs", as it were, can be used without ill effect. The preferred multiplier for the block diagram of FIG. 1 is an AD 539 from Analog Devices. This is a 60 MHz part that is somewhat more complex in its application that is shown in the figure. It is a two-quadrant dual channel part. The loop control signal 13 is constrained to be non-negative. The other input (for $V_{REF}$) is actually two complementary (180° out of phase) signals. This produces from the multiplier two product signals that are then subtracted to form the actual answer. This aspect of the multiplier's operation is in accordance with Analog Device's data sheet for the AD 539, and it desirable as a means to nearly eliminate a spurious component (e.g., baseband feed-through of a pulse envelope) in the multiplier output (believed caused by unwanted, but unavoidable, coupling from the inputs to the output of the multiplier).

At the highest levels of applied RF IN the attenuator 17 is set to zero or to a minimum attenuation. The multiplier 14 works best over only a limited range of control signal power levels, say, 18 db. As the level of the applied RF IN decreases by steps of 18 db below the uppermost range, the attenuator 17 decreases the power level of the COMPARISON RF IN by corresponding steps of 18 db to keep the rest of the loop, including the multiplier 14, inside its optimum dynamic range. The attenuator 17 is controlled by a collection 25 called range control signals. Their origin is discussed in due course below. The range control signals are also applied to the integrator 12, with the effect that as the amount of attenuation at attenuator 17 is increased the integration time constant in the integrator 12 is decreased.

The second place that the loop control signal 13 is applied to element 19, which can be a digital voltmeter, or other digitizing or readout mechanism that performs an analog to digital conversion. That is, the magnitude of the filtered control signal 13 is indicative of the amount of power applied as RF IN, provided that the setting of the attenuator 17 is taken into account.

Digitizing element 19 produces a digital output 20 that, after some arithmetic and in conjunction with range information 24 whose origin is described below, indicates the measured RF power level of RF IN. These computed values are the measured power level information that is used by the rest of the test set (the circuitry to do the arithmetic is not shown). The digitizing element 19 has a range which corresponds to the 18 db steps of dynamic range. If the reading 20 exceeds that range an overflow signal 21 is produced. Likewise, if the reading drops below a selected level of full scale, say, 5% or 10%, then an underflow signal 22 is produced.

A range controller 23 is responsive to the overflow and under flow signals 21 and 22 by producing valid range indication signals 24 and range control signals 25. Essentially, the range controller 23 responds to a continued underflow signal 22 by increasing the amount of attenuation, and to a continued overflow signal 21 by decreasing the amount of attenuation. The reason that the range control signals 25 are shown as separate from the valid range indication signals 24 is that it is generally necessary to inhibit the output, or otherwise indicate that it is not valid, for some period of time following a range change. This allows the loop to settle, or to range again if necessary, and prevents erroneous data from being passed to the rest of the system in the test set.

It will be appreciated that the function of the range controller 23 could be provided independently by the power measurement module within a test set, or that it could be accomplished as an extra piece of overhead by a programmed mechanism (microprocessor or state machine) that also takes care of things in the rest of the test set.

A switch driver circuit 26 creates a 5 MHz signal that controls the "positions" of the RF switch 4 and the synchronous detector 11. The preferred way to do this in the present embodiment is to divide a version 15' of the 20 MHz $V_{REF}$ by four. This has the advantage of locating "complete" cycles of COMPARISON RF IN within the time periods that the RF switch 4 is set to its different positions. (By "complete" we mean that these cycles start and end on or very near their zero crossings.) The result is a cleaner production by the RF detector 7 of that portion of the unipolar output signal 8 corresponding to the power level of COMPARISON RF IN.

A preferred manner of making an RF power measurement with the block diagram 1 of FIG. 1 includes the periodic determination of the output value at 20/24 for an input of zero (call that $V_{ZERO}$). To this end, a suitable switch 28 connects the RF IN terminal 2 of the RF switch 4 to either ground (so that $V_{ZERO}$ can be found) or the applied RF signal to be measured. Now, if the output at 20/24 for an applied RF input is $V_{NULL}$, then the desired result $P_{MEAS}$ or $V_{MEAS}$ is: $V_{MEAS}=[(V_{NULL})^2-(V_{ZERO})^2]^{1/2}$; or perhaps simply: $P_{MEAS}=(V_{NULL})^2-(V_{ZERO})^2$. The squaring is necessary prior to the subtraction because the example detector 7 is a square law detector; if it were of a type whose output voltage is directly proportional to applied power, then no squaring would be needed. As it is, the voltages need to be squared before they correspond to power, and what needs to be subtracted is two power levels. The taking of the root of the difference is only of interest in the case of a square law detector. The root is taken in cases where the test set expects a detector voltage value for a power measurement originating with a square law detector unsupported by further processing, as it were. If the test set is prepared to accept a wattage value from a "self-contained" power meter, then the squaring is not needed.

This is not only good practice with regard to drift, etc., but it also compensates at the lowest levels of RF IN for the offset produced by differential amplifier 11b. How often to find $V_{ZERO}$ is a matter of choice. It might be found once for each new $V_{MEAS}$, or a new $V_{ZERO}$ might be found at the end of a selected time interval, say, every fifteen seconds.

Finally, it will be appreciated that the preferred manner of using the block diagram 1 of FIG. 1 includes the use of stored calibration tables in a memory, and it will be further appreciated that in a test environment there will generally be signal conditioning stages ahead of the circuit of FIG. 1, in which there may be switchable gain stages, filters, etc. The presence of these in the signal path may adjust how the measured value $V_{MEAS}$ is calculated or interpreted.

I claim:

1. A circuit for measuring RF power, the circuit comprising:

a switch driver that generates a switching signal having first and second values;

a first RF switch having an RF output, a switch control input coupled to the switch driver to receive the switching signal, and first and second RF inputs, the first RF input coupled to receive an applied RF signal whose power level is to be measured and the second RF input coupled to receive a comparison RF signal whose power level is controlled to approximate that of the applied RF signal, the RF output being connected to the first RF input when the switching signal has the first value and to the second RF input when the switching signal has the second value;

an RF detector having a detector input coupled to the RF output of the first RF switch and having an RF detector output;

a filter having a filter input coupled to the RF detector output and having a filter output;

an amplifier having an amplifier input coupled to the filter output and having an amplifier output;

a delay unit having a delay unit input coupled to receive the switching signal and having a delay unit output at which appears a delayed switching signal that is delayed behind the switching signal by an amount of time generally equal to the time it takes signals to pass through the RF detector, filter and amplifier recited above;

a synchronous detector having a synchronous detector input coupled to the amplifier output, having a synchronous detector control input coupled to the delay unit output to receive the delayed switching signal, and a synchronous detector output at which appears a signal indicative of whether the signal at the first RF input of the first RF switch is less than, equal to or greater than the signal at the second RF input of the first RF switch;

an integrator having an integrator input coupled to the synchronous detector output and having an integrator output;

an RF reference signal source producing an RF reference signal at a selected power level and at a selected frequency; and an analog multiplier having inputs coupled to the RF reference signal source to receive the RF reference signal and coupled to the integrator output, and having a multiplier output coupled to supply the comparison RF signal to the second RF input of the first RF switch.

2. A circuit as in claim 1 wherein the switch driver includes an input coupled to the RF reference signal source and further wherein the frequency of the switching signal is derived by the switch driver according to frequency division performed upon the RF reference signal.

3. A circuit as in claim 1 further comprising a digitizer having an input coupled to the integrator output and a digital output indicative of the amplitude of the signal produced at the integrator output.

4. A circuit as in claim 3 wherein the digitizer further produces an overflow signal indicative of the condition where the digital output exceeds a full scale value and an underflow signal indicative of the condition where the digital output is less than a selected fraction of the full scale value, and wherein the circuit further comprises:

a range control circuit coupled to the digitizer to receive the overflow and underflow signals and producing therefrom a range control signal at a range control output;

an attenuator having a signal input coupled to the output of the analog multiplier and a range control input coupled to the range control output of the range control circuit, and having an attenuator signal output that is the RF comparison signal supplied to the second RF input of the first RF switch, the attenuator producing amounts of attenuation that are in accordance with the value of the range control signal; and further wherein the integrator is coupled to receive the range control signal of the range control circuit and adjusts its integration time constant in accordance with the value of the range control signal.

5. A circuit as in claim 1 further comprising a second RF switch having an output that is coupled to the first RF input of the first RF switch, the second RF switch also having first and second RF inputs, the first input of the second RF switch coupled to the applied RF signal whose power is to be measured and the second RF input of the second RF switch coupled to a reference power level of zero power, the output of the second RF switch being connected internally to periodically one and then the other of the first and second RF inputs of the second RF switch.

6. A circuit as in claim 1 wherein the amplifier is a log amplifier.

7. A circuit as in claim 1 wherein the RF detector comprises diodes.

8. A circuit as in claim 1 wherein the signal that appears at the synchronous detector output is of one polarity with respect to an internal reference to indicate that the signal at the first RF input of the first RF switch is of a lesser power level than the signal at the second RF input of the first RF switch, is of another polarity with respect to the internal reference to indicate that the signal at the first RF input of the first RF switch is of a greater power level than the signal at the second RF input of the first RF switch, and equals the internal reference to indicate that the signal at the first RF input of the first RF switch is of a power level equal to that of the signal at the second RF input of the first RF switch, the internal reference selected to be slightly different than a null value of that synchronous detector output value which causes no additional integration within the integrator, and the internal reference selected to be greater than the null value in the direction corresponding to the comparison RF input's being less than the applied RF signal whose power level is to be measured.

9. A method of measuring RF power comprising the steps of:

switching, at a switching frequency, an RF detector between an applied RF input signal whose power level is to be measured and a comparison RF signal;

filtering the output of the RF detector to produce an AC waveform at the switching frequency and whose shape is indicative of whether the power level of the comparison RF signal is less than that of the applied RF input signal, equal to that of the applied RF input signal, or greater than that of the applied RF input signal;

amplifying the AC waveform;

converting the amplified AC waveform with a detector operating synchronously with the switching of the RF detector into a DC error signal indicative of whether the power level of the comparison RF signal is less than that of the applied RF input signal, equal to that of the applied RF input signal, or greater than that of the applied RF input signal;

integrating the DC error signal to produce an integrated DC error signal;

multiplying an RF reference signal by the integrated DC error signal to produce the comparison RF signal;

the integrating and multiplying combining to adjust the power level of the comparison RF signal to match that of the applied RF signal; and measuring the value of the integrated DC error signal.

10. A method as in claim 9 further comprising the step of attenuating the comparison RF signal in accordance with the fractional relationship between a fun scale value for the measured integrated DC error signal and actual measured value thereof.

11. A method as in claim 9 further comprising the step of computing the power level of the applied RF input signal from the measured value of the integrated DC error signal.

12. A method as in claim 11 further comprising the step of periodically replacing the applied RF signal with reference input power level of zero power.

* * * * *